__United States Patent__ [19]

Finter et al.

[11] Patent Number: 4,560,643

[45] Date of Patent: Dec. 24, 1985

[54] USE OF PHOTOSENSITIVE COMPOSITIONS OF MATTER FOR ELECTROLESS DEPOSITION OF METALS

[75] Inventors: Jürgen Finter, Freiburg, Fed. Rep. of Germany; Walter Fischer, Reinach, Switzerland

[73] Assignee: Ciba Geigy Corporation, Ardsley, N.Y.

[21] Appl. No.: 551,777

[22] Filed: Nov. 14, 1983

[30] Foreign Application Priority Data

Nov. 25, 1982 [CH] Switzerland ............... 6871/82

[51] Int. Cl.⁴ ................ G03C 5/00; G03C 5/24
[52] U.S. Cl. ..................... 430/346; 430/417; 430/495; 427/98; 427/304; 427/305
[58] Field of Search .............. 430/417, 346, 495; 427/98, 304, 305

[56] References Cited

U.S. PATENT DOCUMENTS

| | | | |
|---|---|---|---|
| 3,959,547 | 5/1976 | Polichette et al. | 428/209 |
| 3,993,802 | 11/1976 | Polichette et al. | 430/495 X |
| 4,084,023 | 4/1978 | Dafter, Jr. | 430/417 |
| 4,084,968 | 4/1978 | Janssen et al. | 430/417 X |
| 4,262,085 | 4/1981 | Ehrich et al. | 430/417 |
| 4,385,182 | 5/1983 | Fischer et al. | 546/187 X |
| 4,451,556 | 5/1984 | Yu | 430/495 X |

Primary Examiner—John E. Kittle
Assistant Examiner—Cynthia Hamilton
Attorney, Agent, or Firm—Luther A. R. Hall; Michael W. Glynn

[57] ABSTRACT

The use of photosensitive compositions of matter for electroless deposition of metals, containing (a) 0.1 to 20 percent by weight of a compound of the formula I

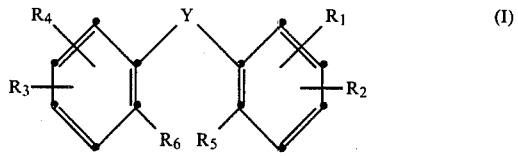

in which Y and $R_1$ to $R_6$ are as defined in patent claim 1, (b) 70 to 99.8% by weight of a polymer with H donor groups and an average molecular weight of at least 2,000 Daltons, or of a polymer mixture of a polymer component with H donor groups and an average molecular weight of at least 2,000 Daltons and a second polymer component with an average molecular weight of at least 3,000 Daltons, and (c) 0.1 to 10% by weight of one or more salts of a metal of group Ib or VIII of the periodic table.

Images, in particular electrically conductive coatings or patterns, can be produced with the above compositions of matter by exposing the compositions of matter to light and then depositing a metal on the zero-valent, non-conductive metal nuclei thereby formed.

20 Claims, No Drawings

USE OF PHOTOSENSITIVE COMPOSITIONS OF MATTER FOR ELECTROLESS DEPOSITION OF METALS

The present invention relates to the use of photosensitive compositions of matter for electroless deposition of metals, by which means images, in particular electrically conductive coatings and patterns, can be produced.

Electrically conductive coatings and patterns, in particular for printed circuits, can be obtained, inter alia, by producing zero-valent metal nuclei which are suitable for electroless deposition of metals on non-conductive inorganic or organic substrates. In the so-called photoformation process, this can be effected by depositing metal salts, in particular salts of non-noble metals, such as copper formate, on the substrate, if appropriate in an acid medium and in the presence of halide ions, and then reducing the salts to zero-valent metal nuclei by irradiation, if appropriate in the presence of chemical reducing agents. Photosensitive reducing agents, a second reducing agent and a surfactant are generally used for the reduction of the metal salts. Photosensitive reducing agents which can be used are, inter alia, anthraquinonedisulfonic acids and salts thereof, if appropriate mixed with metal activators, such as tin salts. In general, before deposition of the metal, the substrates must be slightly etched or provided with a layer of an adhesion promoter which can be etched (intramolecular photoreductive method; compare, for example, U.S. Pat. Nos. 3,959,547 and 3,993,802).

According to another process which is already known, a photosensitive layer containing titanium dioxide is produced on the non-conductive substrate, or titanium dioxide is incorporated into the substrate. The substrate containing the titanium dioxide or the layer containing the titanium dioxide must then be slightly etched in order to render the $TiO_2$ particles accessible for the further treatment. The slightly etched material is then treated with a solution of the desired metal salt and irradiated (photoelectron method). Finally, zero-valent metal nuclei can also be obtained by first depositing a photosensitive metal salt, such as tin-II hydroxide or iron oxalate, on the non-conductive substrate, producing a latent image or producing reducing metal ions by irradiation and then producing the zero-valent metal nuclei by reduction of a metal salt, generally a noble metal salt (photoelectrochemical method). The zero-valent metal nuclei thus obtained can then be metallised in a manner which is known per se by electroless deposition of metal and, if appropriate, the conductive image points can be thickened further by electrolytic deposition of the metal.

It is furthermore known that arylketones, such as benzophenones or thioxanthones, are reduced to arylketyl radicals on actinic irradiation in the presence of H donors, such as hydroxyl or alkylamino groups. This reduced form can in turn reduce other compounds, such as, for example, metal salts. Surprisingly, it has now been found that salts of metals of groups Ib and VIII of the periodic table, especially palladium salts and copper salts, dissolved in the polymer film and reduced in this manner are suitable for electroless deposition of metals and give metallic coatings or patterns with good adhesion.

The invention thus relates to the use of photosensitive compositions of matter for electroless deposition of metals, by which means images, in particular electrically conductive coatings and patterns which have good adhesion, can be produced in a simple manner. The compositions of matter to be used according to the invention contain (a) 0.1 to 20 percent by weight of a compound of the formula I

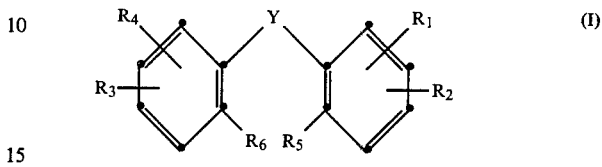

in which $R_1$, $R_2$, $R_3$ and $R_4$ independently of one another are a hydrogen or halogen atom, $C_{1-20}$-alkyl, $-OR_7$, $-N(R_7)_2$, $-SR_7'$, $-NO_2$, $-SO_2R_7'$, $-COR_7$, $-COOR_7$, $-CON(R_7)_2$, $C_{1-4}$-halogenoalkyl, $C_{1-4}$-hydroxyalkyl, $-O-C_dH_{2d}-COOH$, $-O[CH_2CH(X)O]_n-X$,

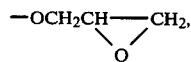

$-OCO-C(X)=CH_2$, $-CO-O[CH_2CH(X)O]_n-X$,

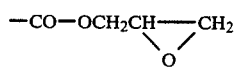

or $-N(R_7)(CO-C(X)=CH_2)$ or $R_1$ and $R_2$ and/or $R_3$ and $R_4$ together are $-CO-O-CO-$ or $-CO-N(R_7)-CO-$, $R_5$ and $R_6$ are each hydrogen or together are a direct bond, $-CH_2-$, $-CH_2CH_2-$, $-CH=CH-$, $-S-$, $-O-$, $-CO-$ or $-NH-$, $R_7$ is hydrogen, $C_{1-20}$-alkyl, $C_{1-6}$-hydroxyalkyl, allyl, propargyl, $-C_dH_{2d}-OCO-C(X)=CH_2$, phenyl, alkylphenyl having 1-4 C atoms in the alkyl moiety, benzyl, phenethyl or cyclohexyl, $R_7'$ has the same meaning as $R_7$, with the exception of hydrogen, n is a number from 1 to 50, d is a number from 1 to 4, X is hydrogen or methyl and Y is $-CO-$ or $-CO-CO-$, (b) 70 to 99.8 percent by weight of a polymer with H donor groups and an average molecular weight of at least 2,000 Daltons, or of a polymer mixture which consists of at least one polymer component with H donor groups and an average molecular weight of at least 2,000 Daltons and at least one second polymer component with an average molecular weight of at least 3,000 Daltons, and (c) 0.1 to 10 percent by weight of one or more salts of a metal of group Ib or VIII of the periodic table, the percentages by weight being based on the sum of a+b+c and components a, b and c together making up 100 percent by weight, and it being possible for the polymer (b) to be partly complexed with the metal salts (c).

Alkyl groups $R_1$, $R_2$, $R_3$, $R_4$, $R_7$ and $R_7'$ having 1-20 C atoms can be straight-chain or branched groups, for example methyl, ethyl, n-propyl, isopropyl, n-butyl, sec.-butyl, tert.-butyl, n-pentyl, 2- or 3-pentyl, n-hexyl, 2-ethylhexyl, n-heptyl, 2- or 3-heptyl, n-octyl, 1,1,3,3-tetramethylbutyl, n-nonyl, n-decyl, 2-decyl, n-dodecyl, n-tetradecyl, n-hexadecyl, n-octadecyl, tridec-7-yl, heptadec-9-yl, 2,6,10-trimethyldodecyl and 2,6,10,14-tetramethylhexadecyl.

Alkyl groups $R_1$ to $R_4$, $R_7$ and $R_7'$ preferably have 1–10 C atoms. Very particularly preferred alkyl groups $R_1$ to $R_4$ are those having 1–4 C atoms, especially methyl and ethyl.

Halogen atoms $R_1$ to $R_4$ or substituents of such radicals are, for example, fluorine and, in particular, chlorine or bromine atoms.

Examples of halogenoalkyl groups $R_1$ to $R_4$ are: —$CCl_3$, —$CBr_3$, —$CF_3$, —$CH_2CH_2Cl$, —$CH_2CH_2Br$, —$(CH_2)_3Cl$ and —$CH_2CH(Cl)CH_2CH_3$.

Hydroxyalkyl groups $R_1$ to $R_4$ or $R_7/R_7'$ are, for example, the hydroxymethyl, 2-hydroxyethyl, 2- or 3-hydroxypropyl, 4-hydroxybutyl, 5-hydroxypentyl and 2-hydroxyhexyl groups. n is preferably a number from 1 to 10, in particular from 1 to 4.

In —$C_dH_{2d}$—COOH radicals $R_1$ to $R_4$ and in —$C_dH_{2d}$—OCO—C(X)=$CH_2$ and alkylphenyl radicals $R_7/R_7'$, the —$C_dH_{2d}$— or alkyl groups can be straight-chain or branched. The groups mentioned are preferably straight-chain. Alkylphenyl groups are, in particular, such groups having 1 to 2 C atoms in the alkyl moiety, such as methylphenyl and ethylphenyl. A phenethyl radical $R_7$ or $R_7'$ is, in particular, the 2-phenethyl group.

Compounds of the formula I which are preferably used are those in which $R_3$ and $R_4$ are hydrogen, $R_1$ is a halogen atom, in particular chlorine or bromine, $C_{1-4}$-alkyl, —$SR_7'$, —$COOR_7$, —$CON(R_7)_2$, chloro- or bromo-alkyl having 1 or 2 C atoms, —CO—O[$CH_2CH(X)O$]$_2$—X or

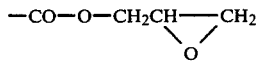

and $R_2$ is hydrogen, $C_{1-4}$-alkyl, $C_{1-3}$-alkoxy, —$COOR_7$, phenylsulfonyl, —$NO_2$, —O[$CH_2CH(X)O$]$_n$—X, —CO—O[$CH_2CH(X)O$]$_n$—X or

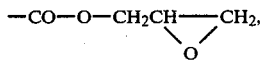

or $R_1$ and $R_2$ are bonded in the ortho-position relative to one another and together are —CO—O—CO— or —CO—N($R_7$)—CO, $R_5$ and $R_6$ are each hydrogen or together are —$CH_2$—, —S—, —O—, —CO— or —NH—, $R_7$ is $C_{1-10}$-alkyl, $C_{1-4}$-hydroxyalkyl, $C_{1-4}$-alkyl-OCO—C(X)=$CH_2$, cyclohexyl or allyl, $R_7'$ has the same meaning as $R_7$, with the exception of hydrogen, n is a number from 1 to 10, Y is —CO— and X is hydrogen or methyl.

Compositions of matter which are particularly preferably used are those which contain 4 to 7 percent weight of a compound of the formula I in which $R_1$ is bonded in the 2-position and is —COO—$C_{1-6}$-alkyl, in particular —COO—n— butyl, or

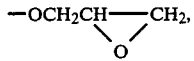

$R_2$, $R_3$ and $R_4$ are hydrogen, $R_5$ and $R_6$ together are —CO— and Y is —CO—, and 87 to 93 percent by weight of component (b) and 3 to 6 percent by weight of component (c).

According to a further preference, compositions of matter are used which contain 4 to 7 percent by weight of a compound of the formula I in which $R_3$ and $R_4$ are hydrogen, $R_1$ and $R_2$ are bonded in the 1-, 2- and/or 3-position and $R_1$ is —COO—$C_{1-6}$-alkyl and $R_2$ is hydrogen, phenylsulfonyl or —$NO_2$, or $R_1$ and $R_2$ are bonded in the 3,4-position and each is —COO—$C_{1-6}$-alkyl or —COO($CH_2CH_2O$)$_n$—$CH_3$, where n=2 or 3, or together are —CO—N($R_7$)—CO—, in which $R_7$ is $C_{2-8}$-alkyl or allyl, $R_5$ and $R_6$ together are —S— and Y is —CO—, and 87 to 93 percent by weight of component (b) and 3 to 6 percent by weight of component (c), especially compositions of matter which contain 4 to 7 percent by weight of a compound of the formula I in which $R_1$ is bonded in the 1-position and is —COO—$C_{1-6}$-alkyl, in particular —COO—n-butyl and $R_2$ is bonded in the 3-position and is hydrogen, —$NO_2$ or phenylsulfonyl, or $R_1$ and $R_2$ are bonded in the 3,4-position and each is —COO—$C_{1-6}$-alkyl or —COO($CH_2C$-$H_2O$)$_2CH_3$ or together are —CO—N($C_{2-8}$-alkyl-)—CO—, $R_3$ and $R_4$ are hydrogen, $R_5$ and $R_6$ together are —S— and Y is —CO—, and 87 to 93 percent by weight of component (b) and 3 to 6 percent by weight of component (c).

The compounds of the formula I are known, or they can be prepared by methods which are known per se. For example, thioxanthones and xanthones of the formula I can be obtained by methods similar to those described in German Offenlegungsschrift No. 3,117,568 (A 1).

Polymers, with H donor groups, of the type defined are, in particular, polymers with hydroxyl, NH or N-alkyl groups, in particular N($CH_3$)$_2$ groups, for example gelatin or partly hydrolysed cellulose esters, for example cellulose acetate. Other polymers with H donor groups which can be used are polymerisation, polycondensation or polyaddition products. Polymerisation products are, in particular, polymers which consist of identical or different recurring structural elements of the formula II

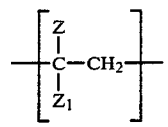 (II)

in which Z is hydrogen, chlorine or methyl and $Z_1$ is hydrogen, chlorine, methyl, —OH, —CN, —COOH, —$CONH_2$, phenyl, methylphenyl, methoxyphenyl, cyclohexenyl, imidazolyl, pyrrolidonyl, —COO-alkyl having 1–12 C atoms in the alkyl moiety, —COOphenyl,

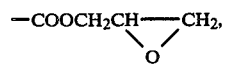

—COO-alkylene—OH having 2–12 C atoms in the alkylene moiety, —COO($CH_2CH_2O$)$_p$H or —COO[$CH_2CH(CH_3)O$]$_p$—H where p=2–4, —O-COalkyl having 1–4 C atoms in the alkyl moiety, —OCOphenyl, —COalkyl having 1–4 C atoms in the alkyl moiety, $C_{1-12}$-alkoxy, phenoxy, hydroxymethylphenyl, —CONH—$C_{1-4}$-alkylene—OH, —COO—$C_{1-4}$-alkylene—N(Q')(Q'') or —OCO($CH_2$)$_x$ OH, where X=2–5, and Q' is hydrogen or $C_{1-5}$-alkyl and Q'' is $C_{1-5}$-alkyl, and in which, in at least 20% of the structural elements of the formula II, $Z_1$ is OH, —COO—$C_{2-12}$-alkylene—OH, —COO($CH_2CH_2O)_p$ H, —COO[$CH_2CH(CH_3)O]_p$—H, —OCO($CH_2)_x$ OH, where x=2-5, hydroxymethylphenyl, —CONH—$C_{1-4}$-alkylene—OH or —COO—$C_{1-4}$-alkylene—N—(Q')(Q'').

If these are copolymers, the various structural elements can be in random or block-like arrangement (block copolymers or graft copolymers).

Alkoxy groups $Z_1$ and alkyl or alkylene groups in the radicals $Z_1$ can be straight-chain or branched.

A —COOalkyl, —COO-alkylene—OH, —COO($CH_2CH_2O)_p$ H, —COO[$CH_2CH(CH_3)O]_p$ H, —OCO-alkyl, —COalkyl, alkoxy, —CONH—$C_{1-4}$-alkylene—OH, —COO-alkylene—N(Q')(Q'') or —O-CO($CH_2)_x$—OH radical $Z_1$ of the type defined is, for example, one of the following radicals: —COOmethyl, —COOethyl, —COO-n-propyl, —COOisopropyl, —COO-n-butyl, —COO-n-pentyl, —COO-n-hexyl, —COO-2-ethylhexyl, —COO-n-octyl, —COO-n-decyl, and —COO-n-dodecyl; —COOCH$_2$CH$_2$OH, —COOCH$_2$CH(OH)CH$_3$, —COO(CH$_2$)$_3$—OH, —COOCH(CH$_3$)$_2$—OH, —COOCH$_2$CH(CH$_3$)$_2$—OH, —COO(CH$_2$)$_4$—OH, —COO(CH$_2$)$_6$—OH, —COO(CH$_2$)$_8$—OH, —COO(CH$_2$)$_{10}$—OH, —COO(CH$_2$)$_{12}$—OH; —OCOCH$_3$, —OCOC$_2$H$_5$, —OCO-n-propyl, —OCO-isopropyl and —OCO-n-butyl; and —COCH$_3$, —COC$_2$H$_5$—, —CO-n-propyl, —CO-isopropyl and —CO-n-butyl; methoxy, ethoxy, n-propoxy, isopropoxy, n-butoxy, n-hexyloxy, 2-ethylhexyloxy, n-octyloxy, n-decyloxy and n-dodecyloxy; —CONH—(CH$_2$)$_2$—OH, —CONH—(CH$_2$)$_3$—OH and —CONH—(CH$_2$)$_4$—OH; —COO(CH$_2$)$_2$N(CH$_3$)$_2$, —COO(CH$_2$)$_2$N(C$_2$H$_5$)$_2$, —COO(CH$_2$)$_3$N(CH$_3$)$_2$, —COO(CH$_2$)$_2$N(n-propyl)$_2$, —COO(CH$_2$)$_4$N(CH$_3$)$_2$, —COO(CH$_2$CH$_2$O)$_2$ H, —COO[CH$_2$CH(CH$_3$)O]$_2$—H, —COO(CH$_2$CH$_2$O)$_3$ H, —COO[CH$_2$CH$_2$(CH$_3$)O]$_3$ H, —OCO(CH$_2$)$_2$—OH, —OCO(CH$_2$)$_3$ OH and —OCO(CH$_2$)$_4$ OH.

Preferably, in 20 to 97.5%, in particular 20 to 70%, of the structural elements of the formula II, $Z_1$ is —OH, —COO—$C_{2-12}$-alkylene—OH, hydroxymethylphenyl, —CONH—$C_{1-4}$-alkylene—OH, —COO—$C_{1-4}$-alkylene—N(Q')(Q''), —COO(CH$_2$CH$_2$O)$_p$ H, —COO[CH$_2$CH(CH$_3$)O]$_p$ H or —OCO(CH$_2$)$_x$—OH, where x=2-5.

Preferred polymers are those of structural elements of the formula II in which Z is hydrogen, chlorine or methyl and $Z_1$ is hydrogen, chlorine, CN, methyl, phenyl, methylphenyl, methoxyphenyl, —COO—$C_{1-10}$-alkyl, —COOphenyl,

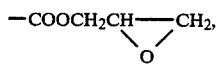

—COO—$C_{2-12}$-alkylene—OH, —CO-alkyl having 1-4, in particular one or two, C atoms, alkoxy having 1-8, in particular 1-4, C atoms, phenoxy, hydroxymethylphenyl, —CONH(CH$_2$)$_2$ OH, —OCO(CH$_2$)$_x$—OH, where x=2-5, or —COO—$C_{1-4}$-alkylene—N(C$_{1-4}$-alkyl)$_2$, the proportion of —COO—$C_{2-12}$-alkylene—OH, hydroxymethylphenyl, —CONH(CH$_2$)$_2$OH, —OCO(CH$_2$)$_x$—OH or —COO—$C_{1-4}$-alkylene—N(C$_{1-4}$-alkyl)$_2$ groups $Z_1$ being 20 to 70%.

Particularly preferred polymers are those of structural elements of the formula II in which Z is hydrogen or methyl and $Z_1$ is methyl, phenyl, methylphenyl, —COO—$C_{1-10}$-alkyl, —COO—$C_{2-12}$-alkylene—OH, hydroxymethylphenyl or —COO—$C_{1-4}$-alkylene—N(CH$_3$)$_2$, the proportion of —COO—$C_{2-12}$-alkylene—OH, hydroxymethylphenyl or —COO—$C_{1-4}$-alkylene—N(CH$_3$)$_2$ groups being 20 to 70%.

Polymers which are especially preferably used are those of structural elements of the formula II in which, in 55–65% of the structural elements, Z is hydrogen or, in particular, methyl and $Z_1$ is —COO(CH$_2$)$_2$N(CH$_3$)$_2$ or, in particular, —COO(CH$_2$)$_2$OH, —COOCH$_2$CH(CH$_3$)—OH or —COO(CH$_2$)$_3$OH, and, in 35–45% of the structural elements, Z is hydrogen or methyl and $Z_1$ is phenyl or —COO—$C_{1-8}$-alkyl, in particular —COOmethyl, —COOethyl or —COO-2-ethylhexyl.

Polycondensation or polyaddition products are, in particular, those which contain identical or different structural elements of the formula III, IV, V or VI

 (III)

 (IV)

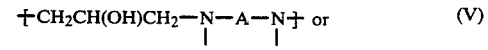 or (V)

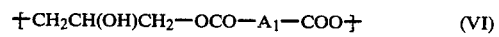 (VI)

and, if appropriate, structural elements of the formula VII

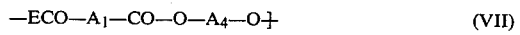 (VII)

in which y is the number 1 or 2, A is —$C_mH_{2m}$—, where m=2–12, cyclohexylene, naphthylene, phenylene which is unsubstituted or substituted by a methyl, methoxy or nitro group, 1,3- or 1,4-xylylene or the radical of 4,4'-diaminodicyclohexylmethane, 4,4'-diaminodiphenylmethane, 4,4'-diaminodiphenyl ether, 4,4'-diaminodiphenyl sulfone or isophoronediamine, $A_1$ is a direct bond, —$C_mH_{2m}$—, where m=2–12, or cyclohexylene, cyclohexenylene, endomethylenecyclohexenylene or phenylene, each of which can be substituted by —CH$_3$, $A_2$ is —$C_mH_{2m}$—, where m=2–12, phenylene,

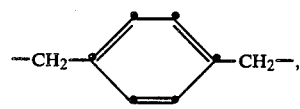

or a group of the formula

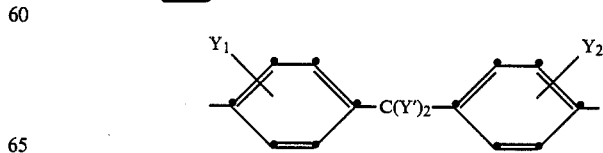

or —(Y$_3$O)$_o$ Y$_3$—, Y' is hydrogen or methyl, $Y_1$ and $Y_2$ independently of one another are hydrogen, chlorine or bromine, $Y_3$ is —(CH$_2$)$_2$—, —CH$_2$CH(CH$_3$)— or —(CH$_2$)$_4$—, o is a number from 1 to 50, $A_3$ is

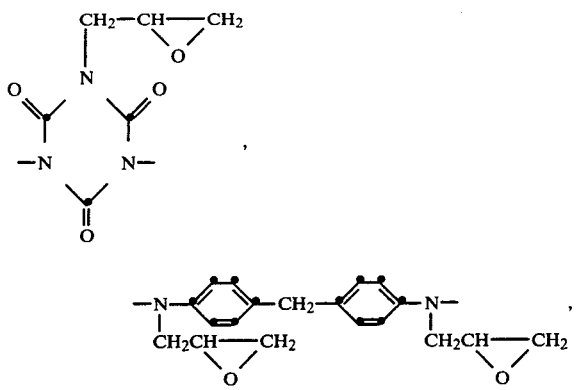

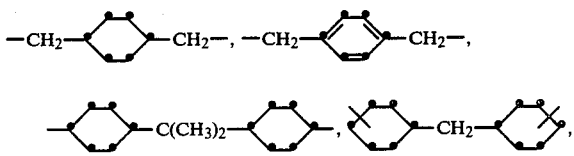

or the radical of ethyleneurea, propyleneurea, 5,5-dimethylhydantoin or 2-hydroxyethyl- or 2-hydroxypropyl-5,5-dimethylhydantoin and $A_4$ is —C$_m$H$_{2m}$—, where m=2–12, —(CH$_2$CH$_2$O$_r$CH$_2$CH$_2$—, where r=1–40, in particular 1–20, —CH(CH$_3$)CH$_2$OCH$_2$CH(CH$_3$)—, cyclohexylene, —CH$_2$C(CH$_3$)$_2$—CH$_2$—OCO—C(CH$_3$)$_2$—CH$_2$—,

naphthylene, biphenylene, or phenylene which is unsubstituted or substituted by a methyl, methoxy or nitro group.

In the polymers of the formulae III to VII, the individual radicals A, $A_1$, $A_2$, $A_3$ and $A_4$ can be identical or different, and the recurring structural elements in these polymers can be arranged randomly or in block form. As defined, mixtures of polymers with H donor groups and H donor group-free polymers may also be present, for example mixtures of polymers having structural elements of the formulae III to VI with polymers consisting of recurring structural elements of the formula VII.

—C$_m$H$_{2m}$— groups A, $A_1$, $A_2$ or $A_4$ can be straight-chain or branched and preferably have 2–10 C atoms. Examples of such groups are: —(CH$_2$)$_2$—, —CH$_2$CH(CH$_3$)—, —(CH$_2$)$_3$—, —(CH$_2$)$_4$—, —(CH$_2$)$_2$—C(CH$_3$)$_2$—(CH$_2$)$_2$—, —(CH$_2$)$_6$—, —C(CH$_3$)$_2$—, —CH$_2$C(CH$_3$)$_2$—CH$_2$—CH(CH$_3$)(CH$_2$)$_2$, —CH$_2$CH(CH$_3$)CH(CH$_3$)CH$_2$CH(CH$_3$)CH$_2$—, —(CH$_2$)$_7$—, —(CH$_2$)$_8$—, —(CH$_2$)$_{10}$— and —(CH$_2$)$_{12}$—.

—C$_m$H$_{2m}$— groups $A_2$ and/or $A_4$ are, in particular, radicals of ethylene glycol, butane-1,4-diol, neopentylglycol or hexane-1,6-diol. A —C$_m$H$_{2m}$— group $A_1$ is, in particular, a radical derived from succinic acid, adipic acid, pimelic acid, azelaic acid or sebacic acid. A —C$_m$H$_{2m}$— radical A is preferably —(CH$_2$)$_2$—, trimethylene, tetramethylene, hexamethylene, —CH$_2$CH(CH$_3$)CH(CH$_3$)CH$_2$CH(CH$_3$)CH$_2$— or —CH$_2$C(CH$_3$)$_2$CH$_2$CH(CH$_3$)CH$_2$CH$_2$—.

A cyclohexylene radical $A_4$ is, in particular, the radical of cyclohexane-1,2-diol. Cyclohexylene groups A and $A_1$ are, in particular, 1,3-cyclohexylene and, especially, 1,4-cyclohexylene.

A naphthylene or biphenylene radical $A_4$ or a phenylene radical $A_4$ which is unsubstituted or substituted by a methyl, methoxy or nitro group is, for example, the radical of 1,4-, 1,6-, 1,8- or 2,6-dihydroxynaphthalene, 2,2′-biphenyl, resorcinol, 2,5-dihydroxyanisole, 1,2-dihydroxy-4-nitrobenzene or 2,5- or 3,4-dihydroxytoluene. $A_4$ is preferably —(CH$_2$)$_2$—, —(CH$_2$)$_4$—, —(CH$_2$)$_6$—, —CH$_2$CH$_2$OCH$_2$CH$_2$—, —C(CH$_3$)$_2$—,

or 1,3-phenylene.

A cyclohexenylene, phenylene or endomethylenecyclohexylene radical $A_1$ which is unsubstituted or substituted by methyl is, for example, a radical derived from tetrahydrophthalic acid, phthalic acid, methyl-tetrahydrophthalic acid, endomethylenetetrahydrophthalic acid, isophthalic acid or terephthalic acid. $A_1$ is preferably —(CH$_2$)$_m$—, where m=2–10, 1,3- or 1,4-phenylene or 1,3- or 1,4-cyclohexylene.

A naphthylene radical A or a phenylene radical A which is unsubstituted or substituted by a methyl, methoxy or nitro group is, for example, one of the following radicals: 1,2-, 1,3- or 1,4-phenylene, 4-methoxy-1,3-phenylene, 2-nitro-1,4-phenylene, o- or m-tolylene or 1,5- or 1,8-naphthylene. A is preferably —C$_m$H$_{2m}$—, where m=2–10, 1,3- or 1,4-phenylene or the radical of 4,4′-diaminodiphenylmethane, 4,4′-diaminodiphenyl ether or isophoronediamine.

A phenylene radical $A_2$ is, in particular, 1,3-phenylene.

In a

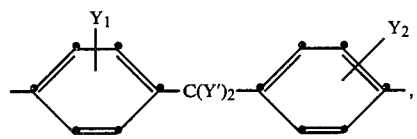

group $A_2$, $Y_1$ and $Y_2$ are preferably each chlorine or bromine, bonded in the 2,2′-position. However, particularly preferred groups are those in which $Y_1$ and $Y_2$ are hydrogen.

In a —(Y$_3$O)$_o$—Y$_3$— group $A_2$, $Y_3$ is preferably —(CH$_2$)$_2$— or —CH$_2$CH(CH$_3$)— and o is, in particular, 1–40, especially 2–20.

$A_2$ is preferably —C$_m$H$_{2m}$—, where m=2, 4 or 6,

or, in particular, a group of the formula

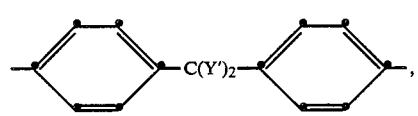

—(CH$_2$CH$_2$O)$_o$—CH$_2$CH$_2$— and/or —[CH$_2$CH(CH$_3$)O]$_o$—CH$_2$CH(CH$_3$)—, where Y′=H or, in particular, methyl and o=1-40, in particular 2-20.

Especially preferred adducts are those of diols of the formula XI

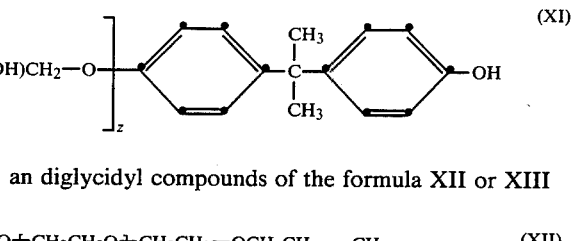

an diglycidyl compounds of the formula XII or XIII

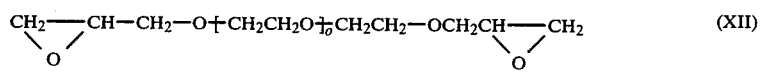

or

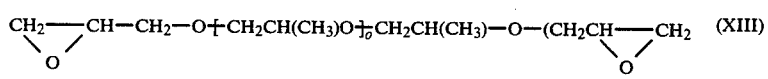

in which z denotes a number from 1 to 8 and o denotes a number from 1 to 10.

Other suitable adducts are glycidyl-phenol novolaks and -cresol novolaks and adducts of diols or dicarboxylic acids of the above type with triglycidyl isocyanurate.

$A_3$ is preferably the radical of triglycidyl isocyanurate, 5,5-dimethylhydantoin or 2-hydroxyethyl- or 2-hydroxypropyl-5,5-dimethylhydantoin.

Adducts which are particularly preferred are those of diols HO—A$_4$—OH, dicarboxylic acids HOOC—A$_1$—COOH, oligoesters, containing carboxylic acid end groups, of the formula VIII HO—[CO—A$_1$—CO—O—A$_4$—O]$_s$—CO—A$_1$—COOH  (VIII)

and/or diamines H$_2$N—A—NH$_2$ and diglycidyl compounds of the formula IX

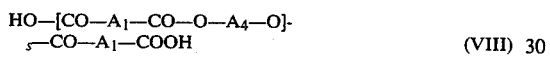 (IX)

in which A is —(CH$_2$)$_m$—, where m=4-10, or the radical of 4,4′-diaminodiphenylmethane, 4,4′-diaminodiphenyl ether or isophoronediamine, A$_1$ is —(CH$_2$)$_m$—, where m=2-10, 1,3- or 1,4-phenylene or 1,3- or 1,4-cyclohexylene, s is a number from 1 to 100, in particular 1 to 20, and A$_2$′ is —C$_m$H$_{2m}$—, where m=2, 4 or 6, or a group of the formula

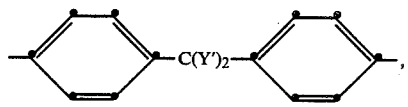

—(CH$_2$CH$_2$O)$_o$—CH$_2$CH$_2$— and/or —[CH$_2$CH(CH$_3$)O]$_o$—CH$_2$CH(CH$_3$)—, where Y′=H or, in particular, methyl and o=1-40, in particular 2-20, or an oligomer of the formula X

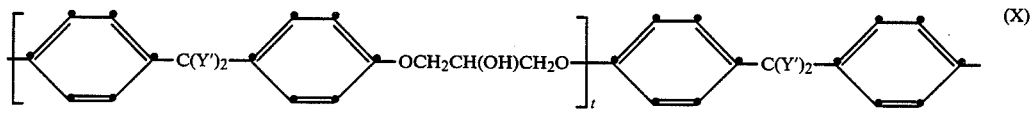

where t=1.2 to 12 and Y′=H or, in particular, methyl, and A$_4$ is —C$_m$H$_{2m}$—, where m=2-12, —(CH$_2$CH$_2$O)$_r$—CH$_2$CH$_2$—, where r=1-40, in particular 1-20, —CH(CH$_3$)CH$_2$OCH$_2$CH(CH$_3$)—, 1,2-cyclohexylene, 2,2′-biphenylene or 1,3-phenylene.

If the polymers to be used according to the invention are linear, they preferably have an average molecular weight of up to 1,000,000, an in particular between 2,000 and 150,000, Daltons. The average molecular weight of the polymers can be determined by known methods, for example by means of osmometry or light scattering.

The compositions of matter to be used according to the invention can also contain other additives, in particular solvents and/or crosslinking agents. Examples of suitable solvents are N,N-dialkylamides of aliphatic monocarboxylic acids having 1-3 C atoms in the acid moiety, such as N,N-dimethylformamide, N,N-dimethylacetamide and N,N-diethylacetamide; mono- and dialkyl ethers of ethylene glycol and diethylene glycol having in each case 1-4 C atoms per alkyl moiety, such as ethylene glycol monomethyl, monoethyl and mono-n-butyl ether, ethylene glycol dimethyl and diethyl ether, diethylene glycol monomethyl, monoethyl and monoisopropyl ether and diethylene glycol dimethyl and diethyl ether; as well as cyclic amides, such as N-methylpyrrolidone; dialkylsulfoxides, such as dimethyl- and diethyl-sulfoxide; chlorobenzene and esters carbonic acid, such as propylene glycol carbonate and diethyl carbonate.

Crosslinking agents which can be used are, for example, alcohols or amines with two or more functional groups and di-, tri- or tetra-carboxylic acids or derivatives thereof, such as anhydrides, depending on the type of functional group in the polymers. Examples of suitable polyfunctional compounds are: diols HO—A$_2$—OH and HO—A$_4$—OH, dicarboxylic acids HOOC—A$_1$—COOH and derivatives thereof, oligoesters of the formula VIII and diamines H$_2$N—A—NH$_2$, in which s, A, A$_1$, A$_2$ and A$_4$ are as defined above; and furthermore glycerol, tris-(hydroxymethyl)-ethane and -propane, pentaerythritol, diethylenetriamine, triethylenetetramine, succinic anhydride, glutaric anhydride, phthalic anhydride, tetrahydrophthalic anhydride, hexahydrophthalic anhydride, trimellitic anhydride, pyromellitic dianhydride and benzophenonetetracarboxylic acid dianhydrides. Di- or poly-carboxylic acids or carboxylic acid anhydrides, such as hexahydrophthalic anhydride or phthalic anhydride, or dihydric or polyhydric alcohols, in particular bisphenol A, are preferably used for crosslinking polymers with OH groups or terminal glycidyl groups.

A certain crosslinking of the compositions of matter to be used according to the invention can also occur by recombination of the H donor radicals formed on exposure of photosensitive compounds of the formula I to light in the presence of polymers with H donor groups. Relatively low irradiation energies are required for this type of crosslinking. Under certain circumstances, such crosslinking takes place even at room temperature. However, chemical crosslinking is preferred.

Suitable salts of metals of groups Ib and VIII of the periodic table are salts with organic or inorganic acids or mixtures thereof, such as carboxylates, for example formates, acetates, stearates, gluconates and citrates; and halides, nitrates, sulfates and perchlorates. Examples are: iron-III acetate, citrate, gluconate, nitrate, sulfate and perchlorate; iron-II or iron-III chloride and iron-II oxalate; ruthenium-III chloride; cobalt-II acetate, nitrate or sulfate; cobalt-II chloride or bromide; rhodium-II acetate and rhodium-III chlorie; nickel-II acetate, nickel-II bromide and chloride and nickel-II sulfate; palladium-II chloride and iodide and palladium acetate and nitrate; copper-II formate and acetate, copper-I or -II chloride, bromide and iodide and copper-II nitrate or sulfate; and silver acetate, chloride, bromide, nitrate or sulfate.

Copper-II carboxylates, in particular copper-II acetate, by themselves or as mixtures with copper-II halides, in particular copper-II bromide, are particularly preferred. As already mentioned, the polymers, to be used according to the invention, with H donor groups can be partly complexed by these metal salts.

The invention also relates to a process for producing images on organic or inorganic substrates, in particular electrically conductive coatings or patterns, especially printed circuits, by exposing a composition of matter to be used according to the invention to light, whereupon zero-valent, non-conductive metal nuclei are formed, and then subjecting the substrate to electroless deposition of a metal, such as copper, nickel, cobalt, silver, tin or the like. If desired, the images thus obtained can be thickened by electrolytic deposition of metal using conventional metal deposition baths. The mixture of compound of the formula I, polymer or polymer mixture with H donor groups and metal salt and, if appropriate, crosslinking agents is advantageously dissolved in a suitable solvent and the solution is applied to the substrate and then exposed through a photomask. Examples of solvents which can be used are those of the type mentioned above. Examples of suitable substrates are glass, metal and metal oxides, such as aluminium, aluminium oxide and copper, ceramics, paper and high molecular weight organic materials. Suitable high molecular weight organic materials are natural and synthetic polymers, for example cellulose materials, such as cellulose acetates, cellulose propionates, cellulose butyrates and cellulose ethers, such as methylcellulose; polymers derived from $\alpha,\beta$-unsaturated acids, such as polyacrylates and polymethacrylates, polyacrylamides and polyacrylonitrile; styrene polymers and copolymers thereof, for example styrene/butadiene copolymers and acrylonitrile/butadiene/styrene copolymers; vinyl and vinylidene polymers and copolymers thereof, such as polyvinyl chloride, polyvinylidene chloride, vinyl chloride/vinylidene chloride copolymers and vinyl chloride/vinyl acetate copolymers; polymers derived from unsaturated alcohols and amines, and derivatives thereof, such as polyvinyl alcohol, polyvinyl acetate and polyallylmelamine; crosslinked epoxide resins; polyacetals; polyalkylene oxides and polyphenylene oxides; polyamides, polyimides, polyamide-polyimie block copolymers, polysulfones and polyesters; an alkyd resins, for example glycerol/phthalic acid resin and mixtures thereof with melamine/formaldehyde resins, and melamine/formalehyde, urea/formaldehyde and phenol/formaldehyde resins and the like.

Any suitable light sources, for example Xenon lamps, metal halide lamps and, in particular, high pressure and medium pressure mercury lamps, can be used for exposing the compositions of matter according to the invention.

EXAMPLES 1–9

(a) Preparation of the Matrix Polymer 78.0 g of 2-hydroxyethyl methacrylate and 73.6 g of 2-ethylhexyl acrylate are dissolved in 600 ml of dioxane, the solution is heated to 70° C., while stirring and under an inert gas, and 1.42 g of azoisobutyronitrile are then added. After 2 hours at 70° C., the product is precipitated by dropwise addition of the mixture to ice-water, while stirring vigorously. Yield: 142.9 g (94% of theory). Glass transition point: 42° C.; $[\eta]=0.59$ dl/g in N,N-dimethylformamide at 25° C.; average molecular weight: 120,000 Daltons (determined by light scattering).

(b) Production of metallic images

In each case 5% by weight of the compounds of the formula I shown in Table I which follows and 5% by weight of copper-II acetate are added to the polymer prepared according to (a), in N,N-dimethylformamide. The solids content of the solution is 30% by weight. A polyester foil is coated with a 50 μm thick wet film of the solution with a roller coater and the film is dried and exposed at 90° C. using a 5 kW high pressure mercury lamp (Staub AG, Neu-Isenburg, Federal Republic of Germany) through a 21-step wedge (21 step sensitivity guide from Stouffer). The resulting image is thickened to a metallic, electrically conductive image at 49° C. in an electroless copper deposition bath of the following composition: 12 g of copper sulfate/liter, 8 g of formaldehyde/liter, 15 g of NaOH/liter, 14 g of sodium potassium tartrate/liter, 20 g of ethylenediaminetetraacetic acid/liter and 1 g of octylphenol polyethylene glycol ether n 1 (Tryton X 100 ® from Röhm+Haas). The results are shown in the following Table I.

TABLE I

| Example No. | Compound of the formula I | Last defined step after 180" |
|---|---|---|
| 1 | Anthrone | 1 |
| 2 | 6-Hydroxyhexyl 2-anthraquinonecarboxylate | 2 |
| 3 | Ethyl 3-nitroxanthone-1-carboxylate | 1 |
| 4 | Methyl thioxanthone-1-carboxylate | 2 |

TABLE I-continued

| Example No. | Compound of the formula I | Last defined step after 180" |
|---|---|---|
| 5 | n-Butyl thioxanthone-1-carboxylate | 4 |
| 6 | Ethyl 3-phenylsulfonyl-thioxanthone-1-carboxylate | 4 |
| 7 | Ethyl 3-nitrothioxanthone-1-carboxylate | 4 |
| 8 | di-n-Butyl thioxanthone-3,4-dicarboxylate | 3 |
| 9 | bis-[2-(2-Methoxyethoxy)ethyl] thioxanthone-3,4-dicarboxylate | 3 |
| 10 | (2-Methacryloyloxy)-ethyl 3-phenylsulfonylthioxanthone-1-carboxylate | 3 |

EXAMPLES 11–14

(a) Preparation of the Matrix Polymer 125.9 g of hydroxypropylmethacrylate (mixture of the 2- and 3-hydroxypropyl esters) and 58.3 g of methyl methacrylate are dissolved in 416 ml of dioxane, the solution is heated to 70° C., while stirring and under an inert gas, and 0.92 g of azoisobutyronitrile is then added. After 12 hours at 70° C., the mixture is diluted with 500 ml of dioxane. The polymer is then isolated by precipitation in 6 liters of ice-water. Yield: 169.3 g (91.5% of theory). Glass transition temperature: 90° C.; $[\eta]=0.65$ dl/g in N,N-dimethylformamide at 25° C.; average molecular weight: 120,000 Daltons (determined by light scattering).

(b) Production of Metallic Images

The polymer prepared according to (a) is dissolved in N,N-dimethylformamide, and in each case 5% by weight of the thioxanthone compounds shown in the table which follows and the equimolar amount of copper-II acetate are added. The solids content of the solution is 30% by weight. A polyester foil is then coated with a 50 μm thick wet film of the solution with a roller coater and the film is exposed to light at 90° through a mask (21 step sensitivity guide from Stouffer) on a vacuum heating stage. A 5 kW high pressure mercury lamp (Staub, Neu-Isenburg, Federal Republic of Germany) is used as the light source. The image of copper nuclei thus obtained is thickened to a metallic, electrically conductive image at 49° C. in an electroless metal deposition bath of the following composition: 12 g of copper sulfate/liter, 8 g of formaldehyde/liter, 15 g of NaOH/liter, 14 g of sodium potassium tartrate/liter, 20 g of ethylenediaminetetraacetic acid/liter and 1 g of octylphenol polyethylene glycol ether/liter. The results are shown in Table II.

TABLE II

| Example No. | Compound of the formula I | Last defined step after 4 minutes |
|---|---|---|
| 11 | Thioxanthone-3,4-dicarboxylic acid N—(2-ethyl-n-hexyl)imide | 8 |
| 12 | Thioxanthone-3,4-dicarboxylic acid N—n-octyl-imide | 4 |
| 13 | di-n-Butyl thioxanthone-3,4-dicarboxylate | 7 |
| 14 | bis-[2-(2-methoxyethoxy)ethyl] thioxanthone-3,4-dicarboxylate | 2 |

EXAMPLES 15–24

(a) 0.1 mole (22.83 g) of bisphenol A and 0.09 mole (31.19 g) of bisphenol A diglycidyl ether are dissolved in 150 ml of ethylene glycol monoethyl ether together with 0.2 ml of N,N-dimethylbenzylamine, and the solution is stirred at 150° C. for 4 hours. The pre-adduct thus obtained is allowed to cool to 40° C. and 3.65 g of a polyethylene glycol diglycidyl ether with an epoxide equivalent of 5.48 equivalents/kg are then added. The mixture is heated again to 150° C., while stirring, and stirred at 150° C. for a further 3 hours and, after cooling, the polymer is precipitated in water. Yield: 56.8 g (98% of theory). Average molecular weight (determined by osmometry)=3,450 Daltons; glass transition temperature=59° C.; epoxide equivalent: 0.088 equivalent/kg.

(b) A polymer is prepared from 0.12 mole of bisphenol A, 0.09 mole of bisphenol A diglycidyl ether and 0.08 equivalent of a polyethylene glycol diglycidyl ether with an epoxide equivalent of 5.48 equivalents/kg, analogously to (a). Yield: 68.1 g (93.06% of theory). Average molecular weight (determined by osmometry): 2,988 Daltons; glass transition temperature=49° C.; epoxide equivalent: 0.13 equivalent/kg.

(c) To test the photosensitivity, 5 g of the polymer, 200 mg of copper-II acetate and 250 mg of a compound of the formula I are dissolved in N,N-dimethylformamide and the solution is applied as a film to a polyester carrier by means of a roller coater. The film is exposed to light at 90° C. through a step wedge (21 steps) using a 5 kW metal halide/mercury lamp and is then treated in an electroless copper deposition bath as described in Examples 1–10.

(d) To prepare crosslinked systems, the reactants are dissolved in N,N-dimethylformamide as described under (c), and hexahydrophthalic anhydride is added. A film is produced from the resulting solution and is dried at 120° C. for 2 hours. After exposure to light and electroless metal deposition as described in Examples 1–10, metal images are obtained.

(e) In each case 0.5 g of polyethylene glycol with an average molecular weight of 3,280 Daltons (determined by osmometry) is also added to the formulations according to paragraph (d), and the formulations are processed as described under (d). The results are shown in Table III.

TABLE III

| Example No. | Compound of the formula I | g of polymer according to Example | g of hexahydrophthalic acid | Last defined stage after 300" |
|---|---|---|---|---|
| 15 | 0.25 g of 2-ethoxyethyl 2-anthraquinonecarboxylate | 5 g according to (a) | 0 | 1 |
| 16 | 0.25 g of 2-ethoxyethyl 2-anthraquinonecarboxylate | 5 g according to (b) | 0 | 3 |
| 17 | 0.25 g of 2-ethoxyethyl | 5 g according to (a) | 0.067 | 1 |

TABLE III-continued

| Example No. | Compound of the formula I | g of polymer according to Example | g of hexahydro-phthalic acid | Last defined stage after 300" |
|---|---|---|---|---|
| 18 | 0.25 g of 2-ethoxyethyl 2-anthraquinonecarboxylate | 5 g according to (b) | 0.102 | 1 |
| 19 | 0.25 g of methyl thioxanthone-1-carboxylate | 5 g according to (a) | 0 | 4 |
| 20 | 0.25 g of methyl thioxanthone-1-carboxylate | 5 g according to (b) | 0 | 6 |
| 21 | 0.25 g of methyl thioxanthone-1-carboxylate | 5 g according to (a) | 0.067 | 1 |
| 22 | 0.25 g of methyl thioxanthone-1-carboxylate | 5 g according to (b) | 0.102 | 2 |
| 23 | 0.25 g of methyl thioxanthone-1-carboxylate | 5 g accprding to (a) | 0.067 | 2 |
| 24 | 0.25 g of methyl thioxanthone-1-carboxylate | 5 g according to (b) | 0.102 | 2 |

EXAMPLE 25

10 g of pre-lengthened bisphenol A/bisphenol A diglycidyl ether resin with an epoxide content of 0.629 equivalent/kg, 2.0 g of 3,3',4,4'-benzophenonetetracarboxylic acid dianhydride and 0.69 g of copper-II acetate are dissolved in 20 ml of N-methylpyrrolidone. A 50 μm thick wet film is produced with a roller coater and is dried at 120° C. for one hour. After exposure to light at 90° C. for 300 seconds using a step wedge of the type described above and subsequent electroless metal deposition according to Examples 1–10, step No. 3 is obtained as the last defined step.

The novel thioxanthone derivatives used in the above Examples 10 and 9–14 can be prepared as follows:

(i) di-n-Butyl thioxanthone-3,4-dicarboxylate 40.0 g of 3-nitrophthalimide and 49.5 g of disodium thiosalicylate [prepared by dissolving thiosalicyclic acid in 2 equivalents of 1N sodium hydroxide solution and evaporation, finally twice with xylene], are stirred in 200 ml of N,N-dimethylformamide (DMF) at 80° C. for 8 hours. The mixture is evaporatred at 70° C. in a rotary evaporator and the residue is filtered off, washed with water and dried. Recrystallisation from dioxane gives 50.2 g (81% of theory) of 3-(2-carboxyphenylthio)-phthalimide; melting point: 289°–290° C.

20.0 g (66.8 mmol) of 3-(2-carboxyphenylthio)-phthalimide are suspended in 130 g of polyphosphoric acid and the suspension is stirred at 150° C. for 90 minutes. The reaction mixture is cooled and stirred carefully with 500 ml of water and the precipitate is filtered off and washed several times with water. After drying in a vacuum drying cabinet at 150° C., the product is recrystallised from xylene. 12.4 g (66% of theory) of thioxanthone-3,4-dicarboxylic acid amide are obtained; melting point 248°–350° C.

4.80 g (17.1 mmol) of thioxanthone-3,4-dicarboxylic acid imide are refluxed in 511 ml of 0.1N NaOH solution for 90 minutes. The mixture of amido and dicarboxylic acid sodium salts formed is acidified with concentrated hydrochloric acid and refluxed for 18 hours. The crude thioxanthone-3,4-dicarboxylic acid is filtered off, washed with water and converted into the anhydride in xylene by refluxing with 11 ml of acetic anhydride, the anhydride precipitating after partial evaporation of the solution. 4.32 g (90% of theory) of thioxanthone-3,4-dicarboxylic acid anhydride are obtained; melting point: 330°–331° C.

2.9 g (10.3 mmol) of thioxanthone-3,4-dicarboxylic acid anhydride, 58 ml of n-butanol, 15 ml of toluene and 0.87 ml of concentrated sulfuric acid are boiled for 20 hours, using a water separator. The mixture is partly evaporated and the residue is taken up in water/methylene chloride. The organic extracts are washed with brine, dried over sodium sulfate and evaporated. The residue is dried at 150° C. under a high vacuum, to give 3.92 g (92% of theory) of di-n-butyl thioxanthone-3,4-dicarboxylate of melting point 49°–51° C.

Analysis for $C_{23}H_{24}O_5S$ (molecular weight: 412.50): Calculated: C 66.97; H 5.86; O 19.39; S 7.77%; Found: C 67.10; H 5.88; O 19.14; S 7.63%.

(ii) bis-[2-(2-Methoxyethoxy)ethyl]thioxanthone-3,4-dicarboxylate 1 g (3.5 mmol) of thioxanthone-3,4-dicarboxylic acid anhydride, 5 ml of diethylene glycol monomethyl ether and 5 drops of concentrated sulfuric acid are reacted as described in Example (i), and the product is isolated. 863 mg (48% of theory) of bis-[2-(2-methoxyethoxy)ethyl] thioxanthone-3,4-dicarboxylate are obtained (liquid; partly crystallises after a few weeks).

Analysis for $C_{25}H_{28}O_9S$ (molecular weight: 504.55): Calculated: C 59.51; H 5.59%; Found: C 59.30; H 5.50%.

(iii) Thioxanthone-3,4-dicarboxylic acid N-(2-ethyl-n-hexyl)imide 2 g (7.1 mmol) of thioxanthone-3,4-dicarboxylic acid anhydride, 0.92 g (7.1 mmol) of 2-ethyl-1-hexylamine and 20 ml of xylene are refluxed for 30 minutes, the water being separated off. On cooling, 2.35 g (85% of theory) of thioxanthone-3,4-dicarboxylic acid N-(2-ethyl-n-hexyl)imide precipitate; melting point: 189°–190° C.

Analysis for $C_{23}H_{23}NO_3S$ (molecular weight: 393.50): Calculated: C 70.20; H 5.89; N 3.56; S 8.15%; Found: C 70.05; H 5.57; N 3.54; S 8.17%.

(iv) Thioxanthone-3,4-dicarboxylic acid N-n-octylimide 4.0 g (14.2 mmol) of thioxanthone-3,4-dicarboxylic acid imide, 4.12 g (21.3 mmol) of 1-octyl bromide, 5.89 g (42.7 mmol) of potassium carbonate and 40 ml of DMF are stirred at 80° C. for 1 day. The mixture is evaporated, the residue is taken up in 2N hydrochloric acid and the mixture is extracted with methylene chloride. The organic phases are washed with saturated NaHCO$_3$ solution and saturated NaCl solution, dried and evaporated. After recrystallisation from cyclohexane, 5.28 g (95% of theory) of thioxanthone-3,4-dicarboxylic acid N-n-octylimide are obtained; melting point: 188°–190° C.

Analysis for C$_{23}$H$_{23}$NO$_3$S (molecular weight 393.50): Calculated: C 70.20; H 5.89; N 3.56; O 12.20; S 8.15%; Found: C 70.05; H 5.86; N 3.71; O 12.77; S 8.11%.

(v) (2-Methacryloyloxy)-ethyl 3-phenylsulfonylthioxanthone-1-carboxylate 0.62 g (1.8 mmol) of 2-hydroxyethyl 3-nitrothioxanthone-1-carboxylate, 0.44 g 82.7 mmol) of sodium benzenesulfinate and 6 ml of N,N-dimethylformamide are stirred at 100° C. for 3 hours. The mixture is evaporated, the residue is taken up in tetrahydrofuran/toluene and the organic phase is washed with NaHCO$_3$ solution, dried over sodium sulfate and evaporated. When recrystallised from tetrahydrofuran/toluene, 0.69 g (87% of theory) of product is obtained; melting point: 231°–3° C.

5.43 g (12.3 mmol) of 2-hydroxyethyl 3-phenylsulfonylthioxanthone-1-carboxylate, 3.87 g (37 mmol) of freshly distilled methacrylyl chloride, 70 ml of dioxane and 1 ml of pyridine are stirred at 80° C. for 10 hours. The mixture is evaporated in vacuo at a maximum temperature of 50° C. The residue is taken up in CH$_2$Cl$_2$ and the mixture is washed with water of pH 6. After drying the organic phase over sodium sulfate, it is evaporated and the residue is recrystallised from toluene. Yield: 5.02 g (80% of theory); melting point: 150°–1° C.

The 2-hydroxyethyl 3-nitrothioxanthone-1-carboxylate can be prepared as follows:

6.02 g (20 mmol) of 3-nitrothioxanthone-1-carboxylic acid, 60 ml of ethylene glycol and 2 drops of concentrated sulfuric acid are refluxed for 3 hours. The mixture is cooled, poured onto water and brought to pH 7 and the precipitate is filtered off and dried. The precipitate is then dissolved in methylene chloride and the solution is dried over sodium sulfate and evaporated. The residue is chromatographed over silica gel using 10% of acetone/90% of CH$_2$Cl$_2$. 2.15 g (31% of theory) of 2-hydroxyethyl 3-nitrothioxanthone-1-carboxylate are first eluted; melting point: 201°–3° C. 2.33 g (30% of theory) of 2-(2-hydroxyethoxy)-ethyl 3-nitrothioxanthone-1-carboxylate are then obtained; melting point: 151°–4° C.

What is claimed is:

1. A process for producing an image on the surface of an inorganic or organic substrate, which consists essentially of exposing a photosensitive composition of matter, coated on said substrate, which composition of matter contains (a) 0.1 to 20 percent by weight of a compound of the formula I

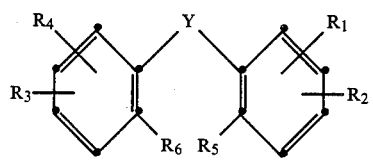
(I)

in which R$_1$, R$_2$, R$_3$ and R$_4$ independently of one another are a hydrogen or halogen atom, C$_{1-20}$-alkyl, —OR$_7$, —N(R$_7$)$_2$, —SR$_7'$, —NO$_2$, —SO$_2$R$_7'$, —COR$_7$, —COOR$_7$, —CON(R$_7$)$_2$, C$_{1-4}$-halogenoalkyl, C$_{1-4}$-hydroxyalkyl, —O—C$_d$H$_{2d}$—COOH, —O[CH$_2$CH(X)O]$_n$—X,

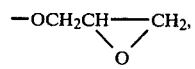

—OCO—C(X)=CH$_2$, —CO—O[CH$_2$CH(X)O]$_n$—X,

or N(R$_7$)(CO—C(X)=CH$_2$) or R$_1$ and R$_2$ and/or R$_3$ and R$_4$ together are —CO—OCO— or —CO—N(R$_7$)—CO—, R$_5$ and R$_6$ are each hydrogen or together are a direct bond, —CH$_2$—, —CH$_2$CH$_2$—, —CH=CH—, —S—, —O—, —CO— or —NH—, R$_7$ is hydrogen, C$_{1-20}$-alkyl, C$_{1-6}$-hydroxyalkyl, allyl, propargyl, —C$_d$H$_{2d}$—OCO—C(X)=CH$_2$, phenyl, alkylphenyl having 1–4 C atoms in the alkyl moiety, benzyl, phenethyl, or cyclohexyl, R$_7'$ has the same meaning as R$_7$, with the exception of hydrogen, n is a number from 1 to 50, d is a number from 1 to 4, X is hydrogen or methyl and Y is —CO— or —CO—CO—, (b) 70 to 99.8 percent by weight of a polymer with H donor groups and an average molecular wieght of at least 2,000 Daltons, or of a polymer mixture which consists of at least one polymer component with H donor groups and an average molecular weight of at least 2,000 Daltons and at least one second polymer component with an average molecular weight of at least 3,000 Daltons, and (c) 0.1 to 10 percent by weight of one or more salts of a metal of group Ib or VIII of the periodic table, the percentages by weight being based on the sum of a+b+c and components a, b and c together make up 100 percent by weight, to light imagewise in order to produce an image of zero-valent, non-conductive metal nuclei and then directly subjecting the resulting image containing substrate to electroless deposition of a metal.

2. A process according to claim 1, wherein the composition of matter contains a compound of the formula I in which R$_3$ and R$_4$ are hydrogen, R$_1$ is a halogen atom, C$_{1-4}$-alkyl, —SR$_7'$, —COOR$_7$, —CON(R$_7$)$_2$, chloro- or bromo-alkyl having 1 or 2 C atoms, —A-CO—O[CH$_2$CH(X)O]n—X or

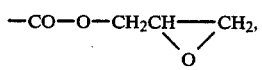

and R$_2$ is hydrogen, C$_{1-4}$-alkyl, C$_{1-3}$-alkoxy, —COOR$_7$, phenylsulfonyl, —NO$_2$, —O[CH$_2$CH(X)O]$_n$—X, —CO—O|CH$_2$CH(X)O|n—X or

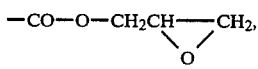

or R$_1$ and R$_2$ are bonded in the ortho-position relative to one another and together are —CO—O—CO— or —CO—N(R$_7$)—CO, R$_5$ and R$_6$ are each hydrogen or together are —CH₂—, —S—, —O—, —CO— or —NH—, R₇ is C₁₋₁₀-alkyl, C₁₋₄-hydroxyalkyl, C₁₋₄-alkyl—OCO—C(X)=CH₂, cyclohexyl or allkyl, R₇' has the same meaning as R₇, with the exception of hydrogen, n is a number from 1 to 10, Y is —CO— and X is hydrogen or methyl.

3. A process according to claim 1, wherein the composition of matter contains 4 to 7 percent by weight of a compound of the formula I in which R₁ is bonded in the 2-position and is —COO—C₁₋₆-alkyl, or

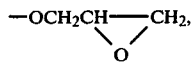
—OCH₂CH——CH₂,
\\ /
O

R₂, R₃ and R₄ are hydrogen, R₅ and R₆ together are —CO— and Y is —CO—, and 87 to 93 percent by weight of component (b) and 3 to 6 percent by weight of component (c).

4. A process according to claim 1, wherein the composition of matter contains 4 to 7 percent by weight of a compound of the formula I in which R₃ and R₄ are hydrogen, R₁ and R₂ are bonded in the 1-, 2- and/or 3-position and R₁ is —COO—C₁₋₆-alkyl and R₂ is hydrogen, phenylsulfonyl or —NO₂, or R₁ and R₂ are bonded in the 3,4-position and each is —COO—C₁₋₆-alkyl or —COO(CH₂CH₂O)ₙ—CH₃, where n=2 or 3, or together are —CO—N(R₇)—CO—, in which R₇ is C₂₋₈-alkyl or allyl, R₅ and R₆ together are —S— and Y is —CO—, and 87 to 93 percent by weight of component (b) and 3 to 6 percent by weight of component (c).

5. A process according to claim 1, wherein the composition of matter contains 4 to 7 percent by weight of a compound of the formula I in which R₁ is bonded in the 1-position and is —COO—C₁₋₆-alkyl, and R₂ is bonded in the 3-position and is hydrogen, —NO₂ or phenylsulfonyl, or R₁ and R₂ are bonded in the 3,4-position and each is —COO—C₁₋₆-alkyl or —COO(CH₂CH₂O)₂CH₃ or together are —CO—N(C₂₋₈-alkyl)—CO—, R₃ and R₄ are hydrogen, R₅ and R₆ together are —S— and Y is —CO—, and 87 to 93 percent by weight of component (b) and 3 to 6 percent by weight of component (c).

6. A process according to claim 1, wherein said polymer consisting of identical or different recurring structural elements of the formula

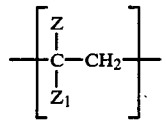

$$\left[\begin{array}{c} Z \\ | \\ C-CH_2 \\ | \\ Z_1 \end{array}\right]$$ (II)

in which Z is hydrogen, chlorine or methyl and Z₁ is hydrogen, chlorine, methyl, —OH, —CN, —COOH, —CONH₂, phenyl, methylphenyl, methoxyphenyl, cyclohexenyl, imidazolyl, pyrrolidonyl, —COO—alkyl having 1-12 C atoms in the alkyl moiety, —COOphenyl,

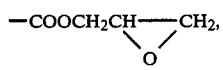
—COOCH₂CH——CH₂,
\\ /
O

—COO—alkylene—OH having 2-12 C atoms in the alkylene moiety, —COO(CH₂CH₂O)ₚ—H or —COO[CH₂CH(CH₃)O]p H where p=2-4, —OCOalkyl having 1-4 C atoms in the alkyl moeity, —OCOphenyl, —COalkyl having 1-4 C atoms in the alkyl moiety, C₁₋₁₂-alkoxy, phenoxy, hydroxymethylphenyl, —CONH— C₁₋₄-alkylene—OH, —COO—C₁₋₄-alkylene—N(Q')(Q'') or —OCO(CH₂)ₓ OH, where x=2-5, and Q' is hydrogen or C₁₋₅-alkyl and Q'' is C₁₋₅-alkyl, and in which, in at least 20% of the structural elements of the formula II, Z₁ is OH, —COO—C₂₋₁₂-alkylene—OH, —COO(CH₂CH₂O)ₚ H, —COO[CH₂CH(CH₃)O]ₚ H, —OCO(CH₂)ₓ—OH, where x=2-5, hydroxymethylphenyl, —CONH—C₁₋₄-alkylene—OH or —COO—C₁₋₄-alkylene—N—(Q')(Q'').

7. A process according to claim 6, wherein Z is hydrogen or methyl and Z₁ is methyl, phenyl, methylphenyl, —COO—C₁₋₁₀-alkyl, —COO—C₂₋₁₂-alkylene—OH, hydroxymethylphenyl or —COO—C₁₋₄-alkylene—N(CH₃)₂, the proportion of —COO—C₂₋₂-alkylene—OH, hydroxymethylphenyl or —COO—C₁₋₄-alkylene—N(CH₃)₂ groups being 20 to 70%.

8. A process according to claim 6, in which, in 55-65% of the structural elements, Z is hydrogen or methyl and Z₁ is —COO(CH₂)₂N(CH₃)₂ or —COO(CH₂)₂OH, —COOCH₂CH(CH₃)OH or —COO(CH₂)₃OH, and, in 35-45% of the structural elements, Z is hydrogen or methyl and Z₁ is phenyl or —COO—C₁₋₈-alkyl.

9. A process according to claim 1, wherein said polymer contains a polycondensation or polyaddition product which contains identical or different structural elements of the formula III, IV, V or VI

$+\text{NH}-A-\text{NH}-\text{CO}-A_1\text{CO}+$, (III)

$+\text{CH}_2\text{CH(OH)CH}_2-O-A_2-O+\text{CH}_2\text{CH(OH)CH}_2-A_3+_{\overline{p-1}}$, (IV)

$+\text{CH}_2\text{CH(OH)CH}_2-N-A-N+$ or (V)

$+\text{CH}_2\text{CH(OH)CH}_2-\text{OCO}-A_1-\text{COO}+$. (VI)

10. A process according to claim 9, in which said polymer contains an addition product of diols HO—A₄—OH, dicarboxylic acids HOOC—A₁—COOH, oligoesters, containing carboxylic acid end groups, of the formula VIII

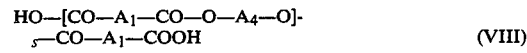
HO—[CO—A₁—CO—O—A₄—O]ₛ—CO—A₁—COOH (VIII)

and/or diamines H₂N—A—NH₂ and diglycidyl compounds of the formula IX

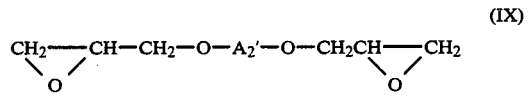
$$CH_2\!\!-\!\!\!-\!\!\!-CH-CH_2-O-A_2'-O-CH_2CH\!\!-\!\!\!-\!\!\!-CH_2 \atop \diagdown\ \diagup \qquad\qquad\qquad\qquad \diagdown\ \diagup \atop O \qquad\qquad\qquad\qquad\qquad\qquad O$$ (IX)

in which A is —(CH₂)ₘ—, where m=4-10, or the radical of 4,4'-diaminodiphenylmethane, 4,4'-diaminodiphenyl ether or isophoronediamine, A₁ is —(CH₂)ₘ—, where m=2-10, 1,3- or 1,4-phenylene or 1,3- or 1,4-cyclohexylene, s is a number from 1 to 100 and A₂' is —CₘH₂ₘ—, where m=2, 4 or 6, or a group of the formula

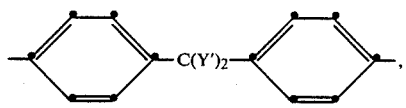

—(CH$_2$CH$_2$O)$_o$—CH$_2$CH$_2$— and/or —[CH$_2$CH(CH$_3$)O]$_o$—CH$_2$CH(CH$_3$)—, where Y'=H or methyl and o=1–40, or an oligomer of the formula X

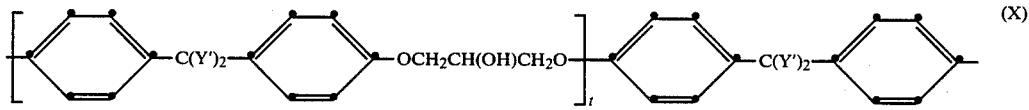

where t=1.2 to 12 and Y'=H or methyl, and A$_4$ is —C$_m$H$_{2m}$—, where m=2–12, —(CH$_2$CH$_2$O)$_r$—CH$_2$CH$_2$—, where r=1–40, —CH(CH$_3$)CH$_2$OCH$_2$CH(CH$_3$)—, 1,2-cyclohexylene, 2,2'-biphenylene or 1,3-phenylene.

11. A process according to claim 9, wherein said polymer contains an addition product of diols of the formula XI

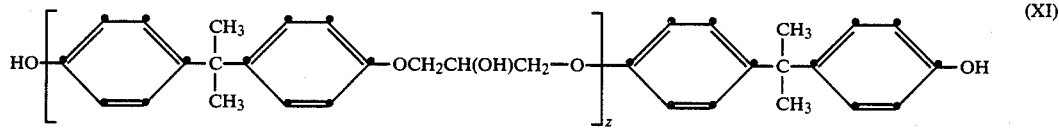

and diglycidyl compounds of the formula XII or XIII

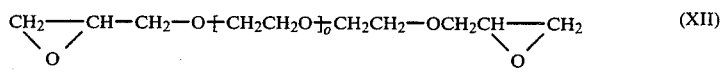

or

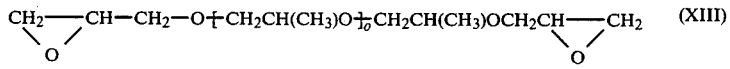

in which z denotes a number from 1 to 8 and o denotes a number from 1 to 10.

12. A process according to claim 1, wherein the metal salt is a copper-II carboxylate, by itself or as a mixture with a copper-II halide.

13. A process according to claim 1, wherein the composition of matter additionally contains a solvent and/or a crosslinking agent.

14. A process according to claim 2, wherein R$_1$ is chlorine or bromine.

15. A process according to claim 3, wherein R$_1$ is —COO-n-butyl.

16. A process according to claim 5, wherein R$_1$ is —COO-n-butyl.

17. A process according to claim 8, wherein Z$_1$ is —COO methyl, —COO ethyl or —COO-2-ethylhexyl.

18. A process according to claim 10, wherein s is from 1 to 20, o is 2–20 and v is 1–20.

19. A process according to claim 12, wherein the metal salt is copper-II acetate, by itself or as a mixture with copper-II bromide.

20. A process according to claim 9 in which said polymer additionally contains structural elements of the formula VII

[CO—A$_1$—CO—O—A$_4$—O]   (VII)

in which y is the number 1 or 2, A is —C$_m$H$_{2m}$—, where m=2–12, cyclohexylene, naphthylene, phenylene which is unsubstituted or substituted by a methyl, methoxy or nitro group, 1,3- or 1,4-xylylene or the radical of 4,4'-diaminodicyclohexylmethane, 4,4'-diaminodiphenylmethane, 4,4'-diaminodiphenyl ether, 4,4'-diaminodiphenyl sulfone or isophoronediamine, A$_1$ is a direct bond, —C$_m$H$_{2m}$—, where m=2–12, or cyclohexylene, cyclohexenylene, endomethylenecyclohexenylene or phenylene, each of which can be substituted by —CH$_3$, A$_2$ is —C$_m$H$_{2m}$—, where m=2–12, phenylene,

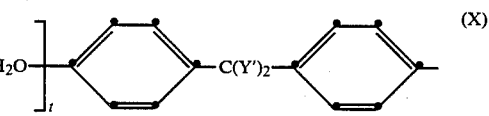

or a group of the formula

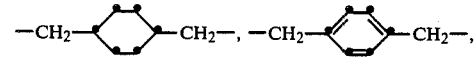

Y' is hydrogen or methyl, Y$_1$ and Y$_2$ independently of one another are hydrogen, chlorine or bromine, Y$_3$ is —(CH$_2$)$_2$—, —CH$_2$CH(CH$_3$)— or —(CH$_2$)$_4$—, o is a number from 1 to 50, A$_3$ is

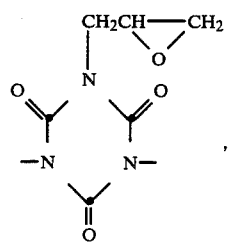

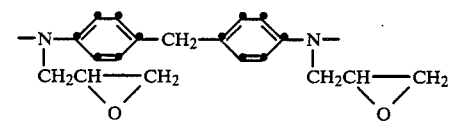

or the radical of ethylene-urea, propylene-urea, 5,5-dimethylhydantoin or 2-hydroxyethyl- or 2-hydroxypropyl-5,5-dimethylhydantoin and $A_4$ is $-C_mH_{2m}-$, where $m=2-12$, $-(CH_2CH_2O)_rCH_2CH_2-$, where $r=1-40$, $-CH(CH_3)CH_2OCH_2CH(CH_3)-$, cyclohexylene, $-CH_2-C(CH_3)_2-CH_2OCO-C(CH_3)_2-CH_2-$,
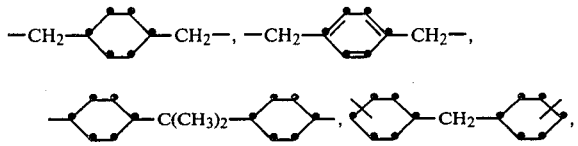
naphthylene, biphenylene, or phenylene which is unsubstituted or substituted by a methyl, methoxy or nitro group.
* * * * *